(12) United States Patent
Jensen et al.

(10) Patent No.: US 9,699,940 B2
(45) Date of Patent: *Jul. 4, 2017

(54) HEAT SINKING

(71) Applicant: HEWLETT-PACKARD DEVELOPMENT COMPANY, L.P., Fort Collins, CO (US)

(72) Inventors: Clinton Troy Jensen, Boise, ID (US); Dan Rothenbuhler, Boise, ID (US); Linden M. Boice, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/198,806

(22) Filed: Jun. 30, 2016

(65) Prior Publication Data

US 2016/0316588 A1 Oct. 27, 2016

Related U.S. Application Data

(63) Continuation of application No. 13/224,010, filed on Sep. 1, 2011, now Pat. No. 9,386,725.

(51) Int. Cl.
| | |
|---|---|
| *H05K 7/20* | (2006.01) |
| *H01L 23/36* | (2006.01) |
| *B41J 2/44* | (2006.01) |
| *H05K 1/02* | (2006.01) |

(52) U.S. Cl.
CPC .......... *H05K 7/20436* (2013.01); *B41J 2/442* (2013.01); *H05K 1/0204* (2013.01)

(58) Field of Classification Search
CPC .... H05K 7/20; H05K 7/20436; H05K 1/0204; H01L 23/36; B41J 2/442
USPC .......................................................... 257/675
See application file for complete search history.

(56) References Cited

U.S. PATENT DOCUMENTS

| | | | |
|---|---|---|---|
| 5,825,401 A | 10/1998 | Wadley et al. | |
| 6,670,699 B2 | 12/2003 | Mikubo et al. | |
| 6,756,684 B2 | 6/2004 | Huang | |
| 7,019,976 B1 | 3/2006 | Ahmad et al. | |
| 7,038,311 B2 | 5/2006 | Woodall et al. | |
| 7,476,980 B2 | 1/2009 | Rebibis et al. | |
| 7,816,754 B2 | 10/2010 | Harvey | |
| 9,386,725 B2 * | 7/2016 | Jensen | H05K 7/20436 |
| 2005/0128715 A1 | 6/2005 | Betman | |
| 2007/0086035 A1 | 4/2007 | Wheless et al. | |
| 2009/0236707 A1 | 9/2009 | Chen et al. | |

FOREIGN PATENT DOCUMENTS

| | | |
|---|---|---|
| JP | 06163758 | 6/1994 |
| JP | 08286783 | 11/1996 |
| JP | 2004363525 | 12/2004 |
| JP | 2008171199 | 7/2008 |

* cited by examiner

*Primary Examiner* — Nguyen Ha
(74) *Attorney, Agent, or Firm* — HP Inc. Patent Department

(57) ABSTRACT

A printed circuit assembly includes a printed circuit board, a heat generating component coupled to the printed circuit board, and a conductive substrate extending parallel to the printed circuit board. The conductive substrate includes a flexing structure and a protrusion disposed on the flexing structure. The protrusion extends toward the printed circuit board opposite the heat generating component.

20 Claims, 5 Drawing Sheets

HEAT SINKING

CROSS-REFERENCE

This Application is a Continuation of U.S. patent application Ser. No. 13/224,010, filed Sep. 1, 2011, entitled "HEAT SINKING", and is incorporated herein by reference.

BACKGROUND

Printed circuit assemblies (PCAs) typically include components that generate heat during operation. For example, PCAs commonly include heat generating ball grid array (BGA) packages, such as application specific integrated circuits (ASICs). Some components generate a significant amount of heat and active removal of heat is employed to avoid premature failure of the component. Cooling these heat generating components is a challenge for optimal performance and reliability.

Various heat removal techniques are currently being used in PCAs. Many of the techniques effectively remove heat from the PCA. Expensive heat removal techniques, however, are typically employed to adequately remove heat from significant heat generating components. Examples of current heat removal techniques include package heat spreaders, natural convection, heat sinks, forced convection, and conduction through the bottom of a printed circuit board. Heat removal techniques on the top of the component, such as fans and various heat sink types, are common. Sinking heat from the bottom side of a component package is less common.

One bottom side of component heat sinking technique employs a thick and malleable conductive pad sandwiched beneath the PCA and in contact with a conductive substrate. Some disadvantages to this technique are, due to the volume of the material, the cost is high and the heat transfer is not very effective. Additionally, the conductive pad is often a weak point of heat transfer. With conduction through the bottom of the PCA, the conductive substrate is often a significant distance away to accommodate backside components and keep out distances (i.e. the minimum distance that must be maintained between the printed circuit assembly and the adjacent structures in order to avoid electrical shorts or physical impact damage).

DETAILED DESCRIPTION

In the following detailed description, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Embodiments provide techniques of sinking heat from a printed circuit board. One embodiment is implemented in a printer formatter. Formatters typically are mounted to a conductive sheet metal surface (i.e. conductive substrate). A formed conductive substrate is embossed to contact a small area just under the approximate center of a heat generating component. The heat from the component package bottom side is conducted directly through ball grid array (BGA) grounding bumps below a chip in the component. The heat generated by the component is transferred through a printed circuit board, though a thin conductive pad, and to the conductive substrate for distribution into a larger surface area. Component top side heat sinking can also be employed to provide additional heat removal.

Figure 1:
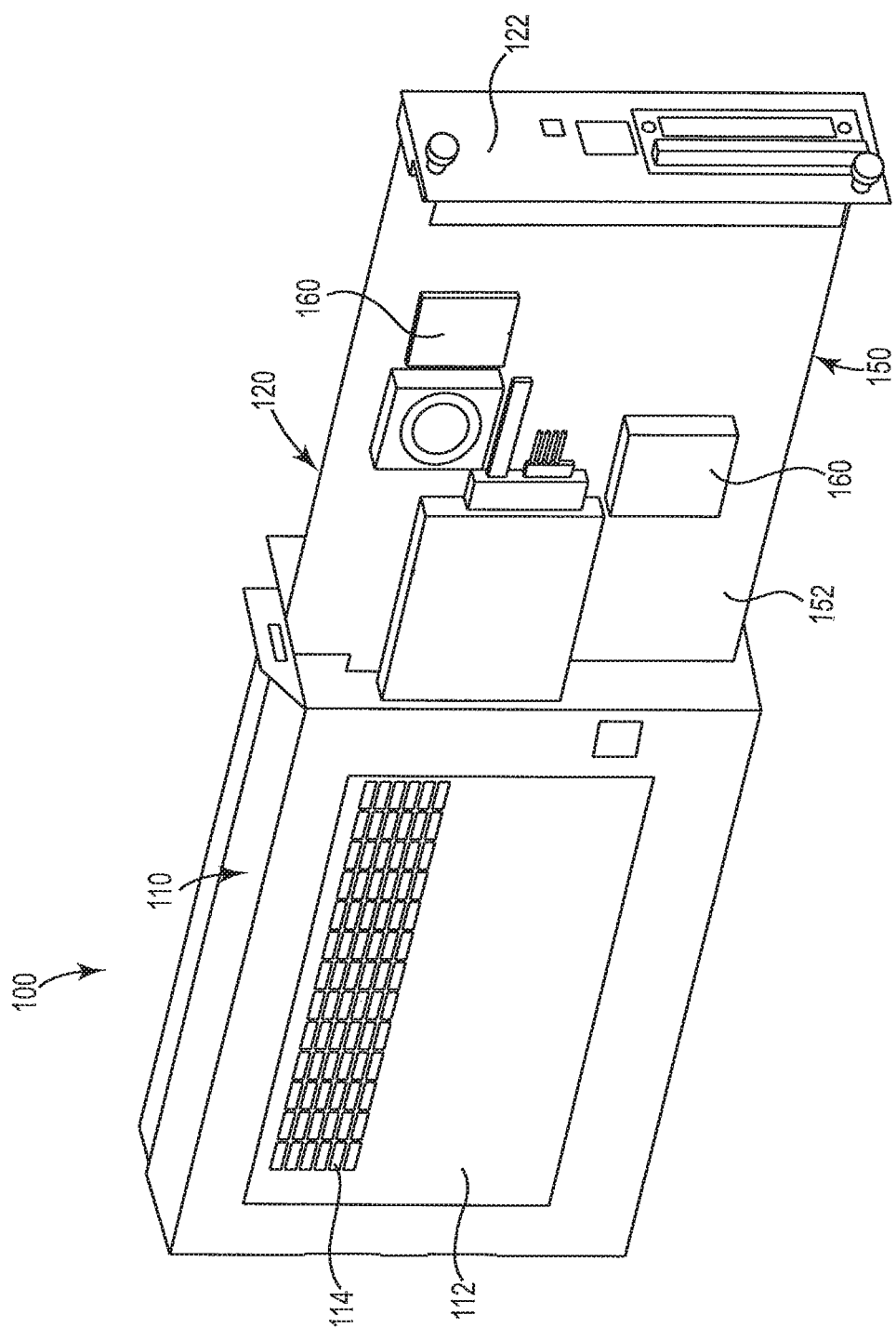
FIG. 1 is a perspective view of one embodiment of a printer formatter.

FIG. 1 illustrates a printer formatter 100 according to one embodiment. Printer formatter 100 includes a printer formatter cage 110 and a formatter assembly 120. In one embodiment, printer formatter 100 is implemented in a laser printer. For clarity of detail, formatter assembly 120 is illustrated extended outside of formatter cage 110, ready for assembly. Formatter cage 110 includes an outer casing 112 with vents 114. Formatter assembly 120 is configured to fit within outer casing 112 with a face plate 122 of formatter assembly 120 to form an exterior of printer formatter 100 in conjunction with outer casing 112 when fully assembled. Formatter assembly 120, discussed further below, includes a printed circuit assembly (PCA) 150 having multiple heat generating components 160.

Figure 2:
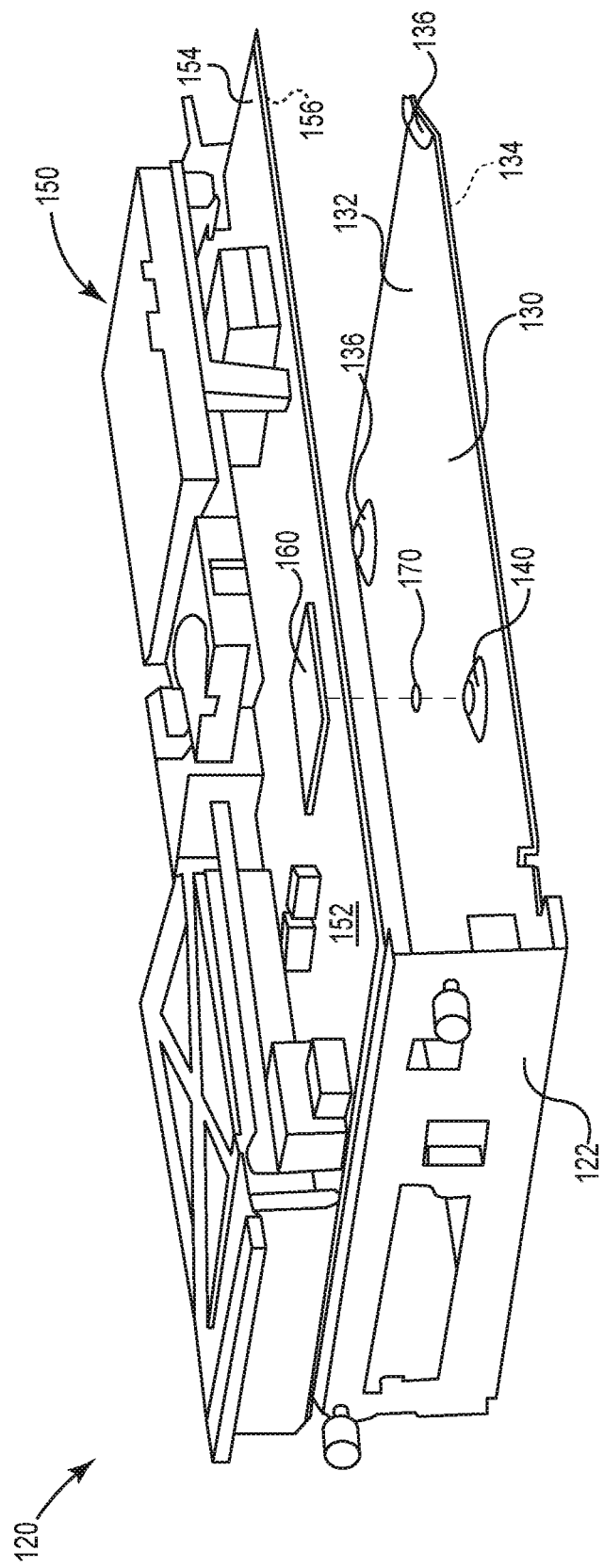
FIG. 2 is a perspective view of one embodiment of a formatter assembly of a printer formatter.

FIG. 2 illustrates formatter assembly 120 according to one embodiment. Formatter assembly 120 includes PCA 150 and a mounting plate 130. For clarity, PCA 150 is illustrated not fully assembled with mounting plate 130 but ready for assembly. PCA 150 includes a printed circuit board 152 having at least one heat generating component 160 coupled to the printed circuit board 152. In one embodiment, heat generating component 160 includes a fusion BGA package wherein heat is generated by a chip located substantially center of the heat generating component 160 package. In one embodiment, heat generating component 160 is an application specific integrated circuit (ASIC).

Mounting plate 130 has a front surface 132, an opposing back surface 134, mounting points 136, and at least one protrusion 140. Printed circuit board 152 has a front surface 154 and an opposing back surface 156. When assembled, back surface 156 of printed circuit board 152 is oriented towards front surface 132 of mounting plate 130 with protrusions 140 and mounting points 136 projecting toward printed circuit board 152. In one embodiment, there is a gap (indicated by arrows 180 in FIG. 3) of approximately 6 mm to 8 mm between back surface 156 of printed circuit board 152 and front surface 132 of mounting plate 130 when assembled. Protrusions 140 decrease the distance in select areas corresponding to the placement of heat generating components 160.

A thermally conductive pad 170 is disposed between printed circuit board 152 and protrusion 140 of mounting plate 130. Thermally conductive pad 170 is adhered to one of protrusion 140 or printed circuit board 152 at a location corresponding to protrusion 140. In one embodiment, when fully assembled protrusion 140 and corresponding thermally conductive pad 170 are positioned substantially center of a back side 162 of the heat generating component 160.

Figure 3:
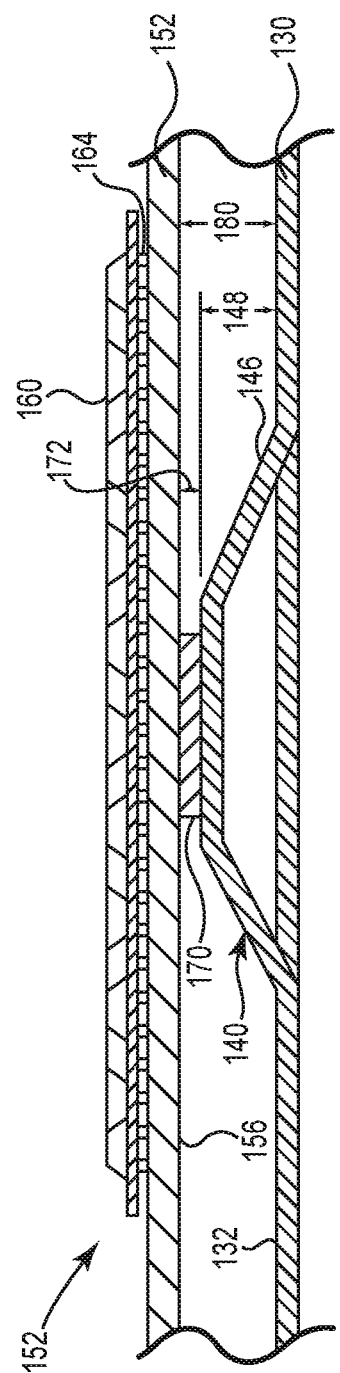
FIG. 3 is a cross-sectional view of one embodiment of a printed circuit assembly.

FIG. 3 illustrates a cross-sectional view of printed circuit board 152 assembled with mounting plate 130 at protrusion 140. Heat generating component 160 is electrically connected to printed circuit board 152 through BGA 164. Heat generated by heat generating component 160 is conducted through BGA 164, to printed circuit board 152, to thermally conductive pad 170, and through protrusion 140 of mounting plate 130. In one embodiment, approximately 8-10 degree Celsius temperature reduction measured at heat generating component 160 is achieved. Mounting plate 130 provides a large surface area to assist convective heat transfer when airflow is available, or ambient air heat transfer when no convection is used, and provides a heat conduction path to transfer heat away from heat generating component 160.

In one embodiment, thermal conductive pad 170 is a relatively thin, compressible pad which improves thermal conductively from printed circuit board 152 to backing plate 130. In one embodiment, the overall area size of thermal conductive pad 170 is made to correspond to the area size of the thermal transfer areas of the heat generating component 160. The compressibility of the thermal interface materials relates to the thermal conductivity. The less compressible thermally conductive pad 170, the higher the conductivity of thermally conductive pad 170. Conversely, the more compressible thermally conductive pad 170, the lower the conductivity of thermally conductive pad 170. As such, it is desirable to achieve a balance between compressibility and conductivity (i.e., minimum percent compression to get sufficient conductivity and maximum percent compression at which the force is too great at which the compression force causes unacceptable PCA deformation). The maximum acceptable force may vary depending on how close PCA mounting points 136, typically used in combination with screws, are to heat generating component 160. The topology of PCA 150 (i.e., flatness with solder bumps, etc.) and adjacent components on back surface 156 of printed circuit board 152, are also factors in determining the desired thickness and material of thermal conductive pad 170.

In one embodiment, thermally conductive pad 170 has a thickness indicated by arrows 172 approximately in the range of 0.5 mm to 2 mm thick. In one embodiment, thermally conductive pad 170 has a thickness indicated by arrows 172 approximately in the range of 0.15 mm to 1.0 mm. Commonly available thermal interface materials are typically available in a range from 0.15 mm to greater than 5 mm thick.

There are several factors to consider to determine a desired thickness (indicated by arrows 172) of thermal conductive pad 170. For example, manufacturing tolerances and relieving stress and strain levels on printed circuit board 152 against mounting plate 130 within PCA 150, although largely accommodated by flex in printed circuit board 152, is considered. Variations in the gap distance 180 between printed circuit board 152 and mounting plate 130 can be +/−0.15 mm for a simple assembly where PCA 150 is mounted directly to mounting plate 130. In more complex assemblies, the variance in gap distance 180 can be +/−1.0 mm. The thickness indicated by arrows 172 of thermal conductive pad 170 is also determined based on the surface roughness of back surface 156 of printed circuit board 152 and protrusion 140 rather than the relative tolerances of printed circuit board 152 and protrusion 140.

Additionally, there are several commercially available types of thermal interface materials. For example, Keratherm 86/500 and Chomerics A570 are commercially available thermal pads. In one example embodiment, an approximately 1.0 mm thick thermally conductive pad 170 compressed approximately 40% through assembly of PCA 150, resulting in approximately 0.6 mm clearance, has a fusion deflection of approximately 50% and does not creep significantly. In one embodiment, thermally conductive pad 170 is compressed prior to assembly. In one embodiment, thermally conductive pad 170 is less compliant and an initial compression upon assembly is less than 40%.

Figure 4:
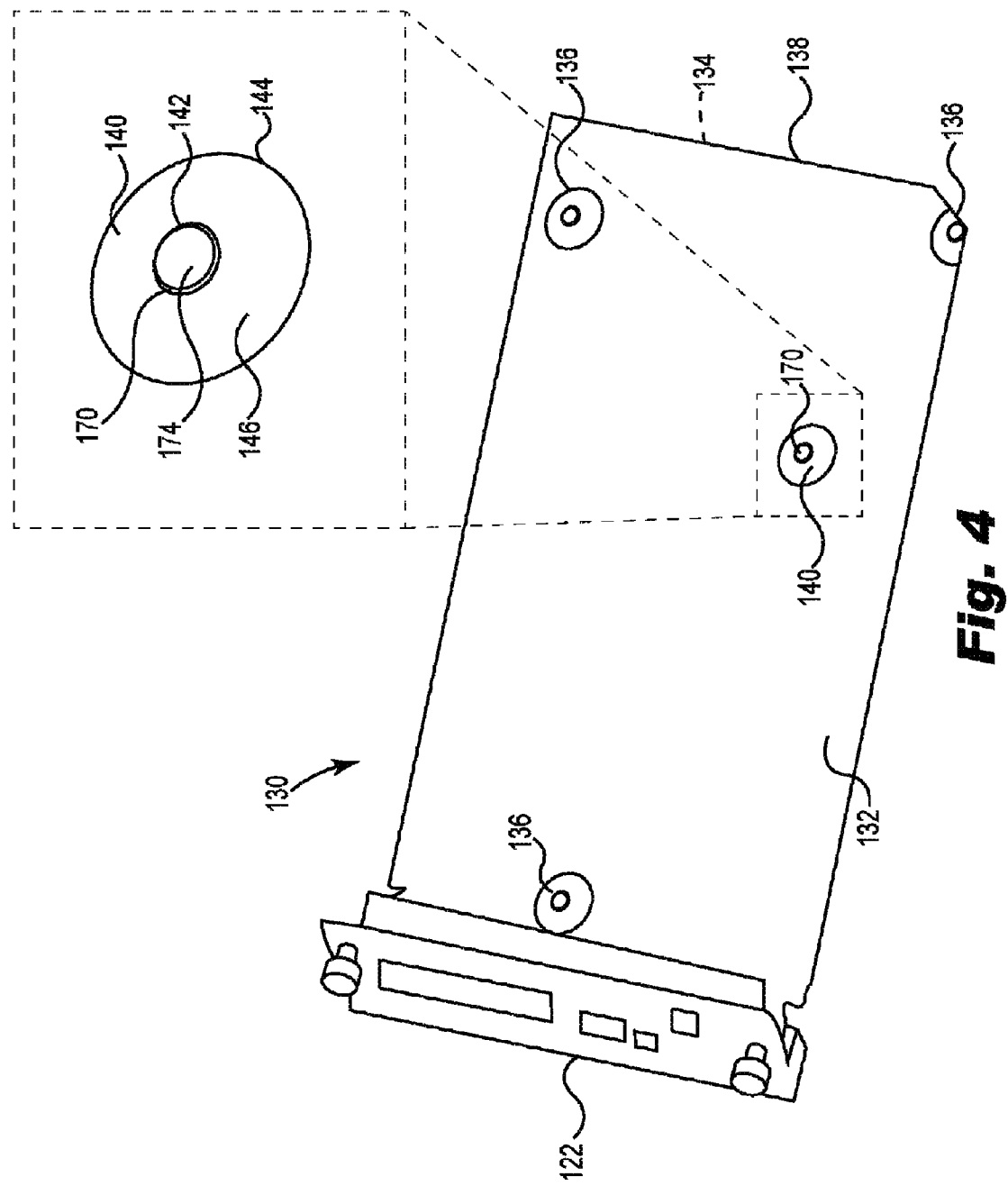
FIG. 4 is a perspective view of one embodiment of a mounting plate.

With reference to FIG. 4, there are also several factors to consider to determine a suitable shape and size of a pad face 174 of thermal conductive pad 170. Embodiments of thermal conductive pad 170 include circular, square, rectangular, and other suitable shapes. The shape and size of pad face 174 generally corresponds to the shape and size of the top 142 of the protrusion 140. In one embodiment, pad face 174 is in the range of 7 mm$^2$ to 100 mm$^2$ in area to correspond to the size of the thermal transfer area of the corresponding heat generating component 160.

Figure 5:
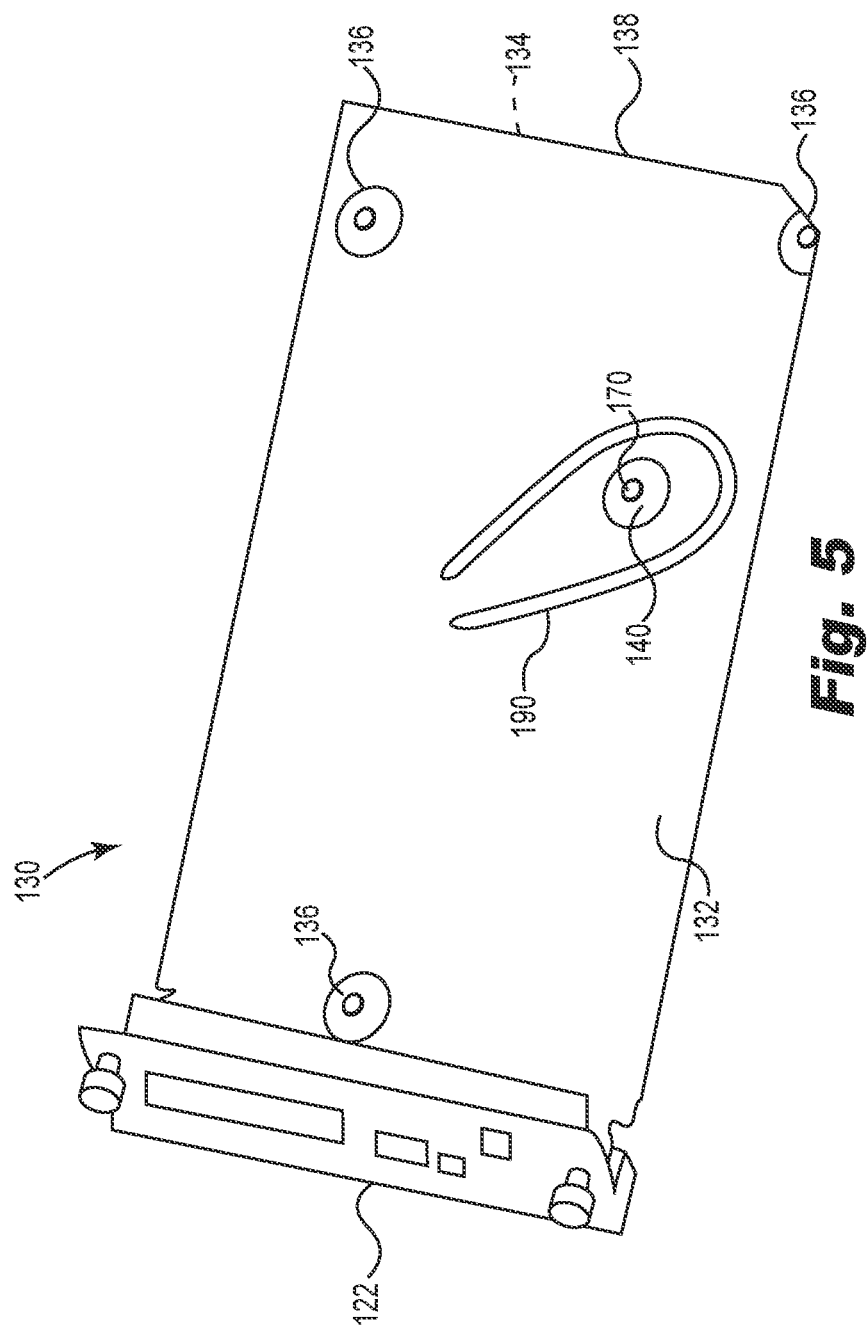
FIG. 5 is a perspective view of one embodiment of a mounting plate.

FIGS. 4 and 5 are perspective views of mounting plate 130 according to embodiments. Mounting plate 130 is a formed conductive plate such as a back plate. Mounting plate 130 can be molded or bent to achieve varying heights across front side 132. In one embodiment, mounting plate 130 includes face plate 122 attached opposite a terminal edge 138. When mounting plate 130 is molded or bent, embossed areas form the mounting points 136 and protrusions 140.

Protrusion 140 is a localized area that provides for an increase in conductivity for removing heat from a component. Mounting plate 130 may have one or several protrusions 140. In one embodiment, the quantity and location of protrusions 140 corresponds to the quantity and locations of heat generating components 160.

With reference to FIGS. 3 and 4, protrusion 140 extends from front side 132 of mounting plate 130 in the same direction as mounting points 136. Protrusion 140 includes a top 142, a bottom 144, and tapered sides 146. Top 142 forms a generally planar surface. In one embodiment, protrusion 140 is "volcano" shaped (i.e., cone-shaped) with a flat top. In one embodiment, Protrusion 140 is parallelepiped. Other embodiments of protrusion 140 include other suitable shapes that taper from top 142 to bottom 144. Protrusion 140 can be a stepped formation or have contiguous tapered sides 146 from top 142 to bottom 144. In one embodiment, mounting points 136 and protrusions 140 are formed in a similar shape.

Generally, bottom 144 has an area of approximately 20 mm$^2$ to 250 mm$^2$, although other sizes may also be appropriate. Factors to consider to determine the proper size and shape of bottom 144 and top 142 of protrusion 140 include: the type of thermal interface material used for a thermal conductive pad 40 which is coupled to top 142; the spacing between printed circuit board 152 and the generally planar front side 132 of mounting plate 130 when assembled; the formability of mounting plate 130 material; and the emboss angle used in forming protrusion 140. Gap distance 180 between printed circuit board 152 and front side 132 of mounting plate 130 can range from 3 mm to 25 mm, and is typically 4 mm to 10 mm. In one embodiment, protrusion 140 is formed by embossing mounting plate 130 using a 30 degree or less conical emboss. Greater emboss angles are also acceptable as allowed by the formability of the mounting plate 130 material.

Protrusions 140 extend a height from front side 132 suitable for placement of thermally conductive pad 170 to be situated between protrusion 140 and printed circuit board 152, as illustrated in FIG. 3. In this manner, protrusion 140 has a height 148 slightly less than a height of mounting points 136, because mounting points 136 extend directly to printed circuit board 152. Top 142 of protrusion 140 is generally planar and parallel when assembled parallel to printed circuit board 152 when assembled with printed circuit board 152. The height 148 of protrusion 140 and mounting points 136 is limited to accommodate the clearance between the bottom side of printed circuit board 152 and front surface 132 of mounting plate 130. The size of top 142 of protrusion 140 may be limited by additional bottom side component placement on the printed circuit board 152. In one embodiment, protrusion 140 and mounting points 136 are formed homogeneously with mounting plate 130 by stamping or embossing mounting plate 130. In one embodiment, mounting plate 130 is a standard sheet metal material.

As illustrated in FIG. 5, mounting plate 130 in one embodiment includes a flexing structure 190 proximal to protrusion 140. Flexing structure 190 provides movement of protrusion 140 relative to the generally planar front surface 132 of mounting plate 130. Flexing structure 190 is configured to flex protrusion 140 to relieve stress at heat generating component 160 attachment location. In addition to thermally conductive pad 170, flexing structure 190 provides stress relief at an attachment area where heat generating component 160 attaches to printed circuit board 152. In one embodiment, flexing structure 190 is stamped or cut out of mounting plate 130. In one embodiment, flexing structure 190 is essentially "U-shaped," forming a cantilevered "springboard" for the protrusion 140. Other configurations of flexing structure 190 that provide stress reduction are also suitable. Factors in the determining the shape, size, and location of the flexing structure 190 include, the stiffness of mounting plate 130 material, stiffness and thickness of thermally conductive pad 170, the desired amount of deflection, and the clearance of the pad thickness.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A printed circuit assembly, comprising:
   a printed circuit board;
   a heat generating component coupled to the printed circuit board; and
   a conductive substrate extending parallel to the printed circuit board, the conductive substrate including a flexing structure and a protrusion disposed on the flexing structure, the protrusion extending toward the printed circuit board opposite the heat generating component.

2. The printed circuit assembly of claim 1, wherein the conductive substrate includes a mounting point extending toward the printed circuit board, the mounting point for coupling the conductive substrate and the printed circuit board, the mounting point defining a distance between the conductive substrate and the printed circuit board.

3. The printed circuit assembly of claim 1, wherein the protrusion has a generally planar top.

4. The printed circuit assembly of claim 1, comprising:
   a thermally conductive pad disposed between the printed circuit board and the protrusion.

5. The printed circuit assembly of claim 4, wherein the protrusion and thermally conductive pad are aligned with the heat generating component.

6. The printed circuit assembly of claim 4, wherein the thermally conductive pad is in the approximate range of 0.5 mm to 2.0 mm thick.

7. The printed circuit assembly of claim 2, wherein the protrusion and the mounting point are monolithic with the conductive substrate.

8. The printed circuit assembly of claim 1, further including at least a second heat generating component, at least a second protrusion, and at least a second thermally conductive pad corresponding to the at least a second heat generating component.

9. The printed circuit assembly of claim 1, wherein the heat generating component is an application specific integrated circuit (ASIC).

10. A printer formatter comprising:
    a printed circuit board;
    a heat generating component coupled to the printed circuit board;
    a backing plate having a protrusion and a mounting point separate from the protrusion, the protrusion and the mounting point extending in a first direction, the backing plate assembled to the printed circuit board at the mounting point, and the mounting point having a first height; and
    a thermally conductive pad disposed between the printed circuit board and the protrusion, the protrusion and the thermally conductive pad having a combined height substantially equivalent to the first height.

11. The printer formatter of claim 10, wherein the protrusion is disposed on a flexing structure.

12. The printer formatter of claim 10, wherein the protrusion is tapered and embossed in the metal backing plate at a location corresponding to the heat generating component upon assembly of the backing plate and the printed circuit board.

13. A mounting plate for a printed circuit assembly, the mounting plate comprising:
    a conductive plate generally extending along a plane;
    a protrusion disposed on the conductive plate and extending from the plane;
    a mounting point disposed on the conductive plate and extending from the plane,
    the conductive plate, the protrusion and the mounting point are formed of a single substrate; and
    a thermally conductive pad disposed between the protrusion and a heat generating component.

14. The mounting plate of claim 13, wherein a base and the top of the protrusion are circular.

15. The mounting plate of claim 13, comprising:
    a flexing structure to allow movement of the protrusion relative to the plane in response to pressure on the protrusion.

16. The mounting plate of claim 13, wherein the thermally conductive pad has a thickness in an approximate range of 0.15 mm to 1.0 mm.

17. The mounting plate of claim 13, wherein the thermally conductive pad is compressible.

18. The mounting plate of claim 13, wherein the thermally conductive pad has a face area in the range of 7 mm2 to 100 mm2.

19. The mounting plate of claim 13, wherein the protrusion has a height less than a height of the mounting point.

20. The mounting plate of claim 13, wherein the protrusion is positioned on the conductive plate to correspond with an approximate center area of the heat generating component on the printed circuit assembly.

* * * * *